US009455290B2

United States Patent
Jin et al.

(10) Patent No.: US 9,455,290 B2
(45) Date of Patent: Sep. 27, 2016

(54) IMAGE SENSOR INCLUDING A PHOTONIC CRYSTAL, AN OPERATING METHOD THEREOF, AND A DATA PROCESSING SYSTEM INCLUDING THE IMAGE SENSOR

(71) Applicant: SAMSUNG ELECTRONICS CO., LTD., Suwon-si, Gyeonggi-do (KR)

(72) Inventors: Hyun Jong Jin, Gwacheon-si (KR); Hyun Seok Lee, Hwaseong-si (KR); Tae Chan Kim, Yongin-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/533,424

(22) Filed: Nov. 5, 2014

(65) Prior Publication Data
US 2015/0123230 A1 May 7, 2015

(30) Foreign Application Priority Data
Nov. 6, 2013 (KR) .................. 10-2013-0134425

(51) Int. Cl.
*H01L 27/146* (2006.01)

(52) U.S. Cl.
CPC ..... H01L 27/14621 (2013.01); H01L 27/1464 (2013.01); H01L 27/14627 (2013.01); H01L 27/14645 (2013.01)

(58) Field of Classification Search
CPC .................. H01L 27/14621; H01L 27/14627; H01L 27/1464; H01L 27/14645
USPC .......................................... 257/432
See application file for complete search history.

(56) References Cited

U.S. PATENT DOCUMENTS

| | | | |
|---|---|---|---|
| 7,250,591 B2 | 7/2007 | Mouli | |
| 7,335,962 B2 | 2/2008 | Mouli | |
| 7,675,023 B2 | 3/2010 | Kim | |
| 8,093,091 B2 | 1/2012 | Mouli | |
| 8,334,493 B2 | 12/2012 | Yokogawa | |
| 2006/0126695 A1* | 6/2006 | Koyama | H01S 5/0264 372/50.124 |
| 2008/0170143 A1 | 7/2008 | Yoshida | |
| 2011/0128423 A1 | 6/2011 | Lee et al. | |
| 2012/0211850 A1* | 8/2012 | Kuboi | H01L 27/1462 257/432 |
| 2012/0293858 A1* | 11/2012 | Telfer | G02F 1/167 359/296 |
| 2013/0032915 A1 | 2/2013 | Tonotani et al. | |
| 2013/0093034 A1* | 4/2013 | Kokubun | H01L 27/14621 257/432 |
| 2013/0264670 A1* | 10/2013 | Kamimura | H01L 31/02 257/431 |

FOREIGN PATENT DOCUMENTS

| | | |
|---|---|---|
| JP | 2004-333537 | 11/2004 |
| JP | 2010-223989 | 10/2010 |
| KR | 1020060077118 | 7/2006 |
| KR | 100656082 | 12/2006 |
| KR | 1020100056183 | 5/2010 |
| KR | 1020110001255 | 1/2011 |
| KR | 1020110037204 | 4/2011 |
| KR | 1020120107755 | 10/2012 |

* cited by examiner

*Primary Examiner* — Fernando L Toledo
*Assistant Examiner* — Adam S Bowen
(74) *Attorney, Agent, or Firm* — F. Chau & Associates, LLC

(57) ABSTRACT

An image sensor including: a plurality of pixels, wherein a first pixel of the pixels includes: a first photoelectric conversion element; and a first microlens overlapping the first photoelectric conversion element, wherein the first microlens reflects wavelengths of a first region of visible light and allows wavelengths of second and third regions of visible light to pass through to the first photoelectric conversion element.

11 Claims, 12 Drawing Sheets

IMAGE SENSOR INCLUDING A PHOTONIC CRYSTAL, AN OPERATING METHOD THEREOF, AND A DATA PROCESSING SYSTEM INCLUDING THE IMAGE SENSOR

CROSS-REFERENCE TO RELATED APPLICATION

This application claims priority under 35 U.S.C. §119(a) to Korean Patent Application No. 10-2013-0134425 filed on Nov. 6, 2013, the disclosure of which is incorporated by reference herein in its entirety.

TECHNICAL FIELD

The present inventive concept relates to an image sensor, and more particularly, to an image sensor including a photonic crystal which may increase light transmittance and may be used as a reflective color filter, an operating method thereof, and a data processing system including the image sensor.

DISCUSSION OF THE RELATED ART

In an image sensor including a color filter per pixel, the color filter may allow only one third of incident visible light to pass through.

Due to this loss of incident visible light, the number of photons reaching a photoelectric conversion element formed at a lower part of the color filter is decreased.

A photonic crystal may have a bandgap or a photonic bandgap which blocks light of a specific frequency. For example, when two types of materials with different refractive indexes are periodically arranged at about a half wavelength of a specific light, a photonic bandgap which blocks the specific light is generated.

SUMMARY

An exemplary embodiment of the inventive concept provides an image sensor comprising: first, second and third pixels, the first pixel includes a first microlens overlapping a first photoelectric conversion element, the second pixel includes a second microlens overlapping a second photoelectric conversion element, and the third pixel includes a third microlens overlapping a third photoelectric conversion element, the first, second and third photoelectric conversion elements are formed in a semiconductor substrate; an intermediate layer is disposed on the first, second and third photoelectric conversion elements, the first, second and third microlenses each has a curved surface, protrusions and grooves are arranged in each of the curved surfaces, and the protrusions or the grooves are arranged at uniform intervals in each of the curved surfaces, the first microlens reflects wavelengths of a first region of visible light and allows wavelengths of second and third regions of visible light to pass through to the first photoelectric conversion element, the second microlens reflects the wavelengths of the second region of visible light and allows the wavelengths of the first and third regions of visible light to pass through to the second photoelectric conversion element, and the third microlens reflects the wavelengths of the third region of visible light and allows the wavelengths of the first and second regions of visible light to pass through to the third photoelectric conversion element.

The image sensor is a backside illumination (BSI) CMOS image sensor.

A dimension of the protrusions or grooves are different from each other between two adjacent pixels.

A refractive index of the protrusions is greater than a refractive index of a material disposed in the grooves.

The first photoelectric conversion element includes a photodiode, a photo transistor or a photo gate.

When the first region of visible light reflected by the first microlens is a red region of visible light, the second and third regions of visible light passing through the first microlens are green and blue regions of visible light, when the first region of visible light reflected by the first microlens is the green region of visible light, the second and third regions of visible light passing through the first microlens are the red and blue regions of visible light, or when the first region of visible light reflected by the first microlens is the blue region of visible light, the second and third regions of visible light passing through the first microlens are the red and green regions of visible light.

A horizontal width of the first microlens is greater than a horizontal width of the first photoelectric conversion element.

An exemplary embodiment of the inventive concept provides an image sensor comprising: a plurality of pixels, wherein a first pixel of the pixels includes: a first photoelectric conversion element; a first microlens overlapping the first photoelectric conversion element; and a first photonic crystal disposed between the first photoelectric conversion element and the first microlens, wherein the first photonic crystal reflects wavelengths of a first region of visible light passing through the first microlens and allows wavelengths of second and third regions of visible light to pass through to the first photoelectric conversion element.

The image sensor is a backside illumination (BSI) CMOS image sensor.

The first microlens has a curved surface, protrusions and grooves are arranged in the curved surface, and the protrusions or the grooves are arranged at uniform intervals.

The first photonic crystal includes a plurality of unit photonic crystals stacked with respect to each other in a vertical direction.

Each of the unit photonic crystals includes protrusions and grooves, and the protrusions or grooves are alternately arranged in the vertical direction.

A unit photonic crystal includes protrusions and grooves formed between the protrusions.

The protrusions and grooves are alternately arranged.

The grooves of a first unit photonic crystal overlap the protrusions of a second unit photonic crystal, wherein the first and second unit photonic crystals are disposed adjacent to each other.

A refractive index of a protrusion is greater than a refractive index of a material disposed in a groove.

A second pixel of the pixels includes: a second photoelectric conversion element; a second microlens overlapping the second photoelectric conversion element; and a second photonic crystal disposed between the second photoelectric conversion element and the second microlens, wherein the second photonic crystal reflects the wavelengths of the second region of visible light passing through the second microlens and allows the wavelengths of the first and third regions of visible light to pass through to the second photoelectric conversion element.

The second photonic crystal includes a plurality of unit photonic crystals stacked with respect to each other in a vertical direction, the unit photonic crystals of the second photonic crystals include protrusions and grooves formed between the protrusions, and a dimension of a protrusion or a groove of the unit photonic crystals of the second photonic crystals is different from a dimension of a protrusion or a groove of the unit photonic crystals of the first photonic crystals.

The protrusions and grooves of the unit photonic crystals of the second photonic crystals are alternately arranged in a vertical direction.

An exemplary embodiment of the inventive concept provides a data processing system comprising: an image sensor including: a pixel array, the pixel array including a plurality of pixels configured to output pixel signals corresponding to an object; and a readout circuit configured to output a digital image signal corresponding to the pixel signals, wherein a first pixel of the pixels includes: a first photoelectric conversion element; and a first microlens overlapping the first photoelectric conversion element, wherein the first microlens reflects wavelengths of a first region of visible light and allows wavelengths of second and third regions of visible light to pass through to the first photoelectric conversion element.

The first microlens includes protrusions and grooves disposed on its surface.

The data processing system is included in a mobile device.

The data processing system further comprises: a timing generator; a row driver configured to drive control signals for controlling an operation of the pixels according to a control of the timing generator; and a control register block configured to control an operation of the timing generator.

The data processing system further comprises a reference signal generator configured to operate according to a control of the timing generator and the control register block.

The data processing system further comprises a buffer configured to operate according to a control of the control register block.

The data processing system further comprises an image signal processor configured to receive the digital image signal corresponding to the pixel signals output from the readout circuit from the buffer.

An exemplary embodiment of the inventive concept provides a data processing system comprising: an image sensor including: a pixel array, the pixel array including a plurality of pixels configured to output pixel signals corresponding to an object; and a readout circuit configured to output a digital image signal corresponding to the pixel signals, wherein a first pixel of the pixels includes: a first photoelectric conversion element; a first microlens overlapping the first photoelectric conversion element; and a first photonic crystal disposed between the first photoelectric conversion element and the first microlens, wherein the first photonic crystal reflects wavelengths of a first region of visible light passing through the first microlens and allows wavelengths of second and third regions of visible light to pass through to the first photoelectric conversion element.

The first photonic crystal includes a, plurality of nit photonic crystals arranged in stacked rows.

A unit photonic crystal includes protrusions and grooves formed between the protrusions.

The data processing system is included in a mobile device.

The data processing system further comprises: a timing generator; a row driver configured to drive control signals for controlling an operation of the pixels according to a control of the timing generator; and a control register block configured to control an operation of the timing generator.

The data processing system further comprises a reference signal generator configured to operate according to a control of the timing generator and the control register block.

The data processing system further comprises a buffer configured to operate according to a control of the control register block.

The data processing system further comprises an image signal processor configured to receive the digital image signal corresponding to the pixel signals output from the readout circuit from the buffer.

An exemplary embodiment of the inventive concept provides an image sensor comprising: first and second pixels, the first pixel including a first photonic crystal disposed between a first photoelectric conversion element and a first microlens, wherein the first photonic crystal reflects wavelengths of first light passing through the first microlens and allows wavelengths of second and third light to pass through to the first photoelectric conversion element, and the second pixel including a second photonic crystal disposed between a second photoelectric conversion element and a second microlens, wherein the second photonic crystal reflects wavelengths of the second light passing through the second microlens and allows wavelengths of the first light and the third light to pass through to the second photoelectric conversion element, wherein the first photonic crystal includes a plurality of unit photonic crystals, wherein each of the unit photonic crystals includes protrusions and grooves alternately arranged in a horizontal direction, and the unit photonic crystals are stacked with respect to each other in a vertical direction.

BRIEF DESCRIPTION OF THE DRAWINGS

The above and other features of the present inventive concept will become more apparent by describing in detail exemplary embodiments thereof, with reference to the accompanying drawings of which.

DETAILED DESCRIPTION OF THE EMBODIMENTS

Figure 1:
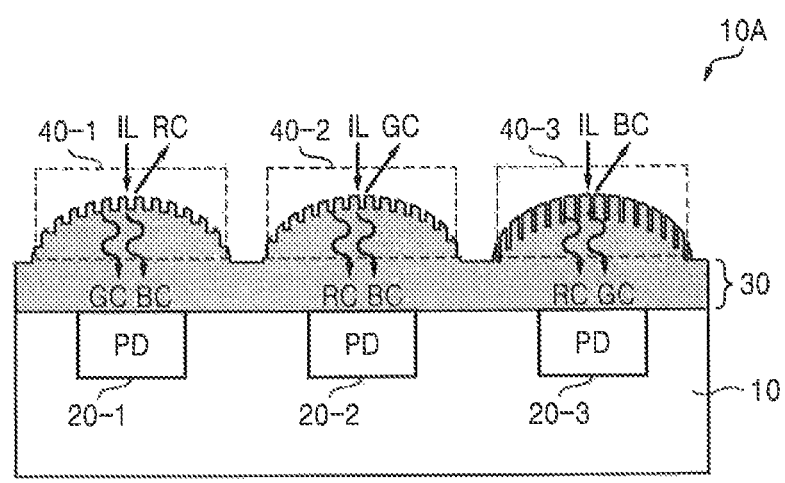
FIG. 1 is a cross-sectional view of pixels of an image sensor according to an exemplary embodiment of the present inventive concept.

Hereinafter, exemplary embodiments of the present inventive concept will be described in detail with reference to the accompanying drawings. Like reference numerals may refer to like elements throughout the accompanying drawings and written description.

A photonic crystal in accordance with an exemplary embodiment of the present inventive concept may include an uneven pattern, e.g., protrusions and grooves. The protrusions and the grooves may be formed through an etching process. Here, a protrusion may be a portion which is not etched by the etching process, and a groove may be a portion which is etched by the etching process.

FIG. 1 is a cross-sectional view of pixels of an image sensor according to an example embodiment of the present inventive concept. Referring to FIG. 1, pixels 10A of an image sensor include a plurality of photoelectric conversion elements 20-1, 20-2, and 20-3 and a plurality of microlenses 40-1, 40-2, and 40-3. The image sensor may be embodied in a front side illumination (FSI) image sensor or a back side illumination (BSI) image sensor.

The plurality of photoelectric conversion elements 20-1, 20-2, and 20-3 may be formed in a semiconductor substrate 10. Each of the plurality of photoelectric conversion elements 20-1, 20-2, and 20-3 may be embodied in a photodiode, a photo transistor, a photogate, or a pinned photo diode.

Each of the plurality of microlenses 40-1, 40-2, and 40-3 may be formed or arranged on or above each of the plurality of photoelectric conversion elements 20-1, 20-2, and 20-3.

Each of the plurality of microlenses 40-1, 40-2, and 40-3 may perform a function of a two-dimensional (2D) photonic crystal color reflector.

Each of a plurality of photonic crystals may be formed by etching an upper surface of each of the plurality of microlenses 40-1, 40-2, and 40-3. Accordingly, each of the plurality of microlenses 40-1, 40-2, and 40-3 may function as a color filter and a microlens.

A first microlens 40-1 including a first photonic crystal has a structure to reflect wavelengths RC of a red region among visible light IL and to allow wavelengths GC of a green region and wavelengths BC of a blue region to pass through.

A second microlens 40-2 including a second photonic crystal has a structure to reflect the wavelengths GC of the green region among the visible light IL and to allow the wavelengths RC of the red region and the wavelengths BC of the blue region to pass through.

A third microlens 40-3 including a third photonic crystal has a structure to reflect the wavelengths BC of the blue region among the visible light IL and to allow the wavelengths RC of the red region and the wavelengths GC of the green region to pass through.

The pixels 10A of the image sensor may further include an intermediate layer 30 formed between the semiconductor substrate 10 and the plurality of photonic crystals 40-1, 40-2, and 40-3. For example, the intermediate layer 30 may include at least one of a metal layer and a dielectric layer.

According to an exemplary embodiment of the present inventive concept, the wavelengths GC and BC passing through the first microlens 40-1 are directly incident on the first photoelectric conversion element 20-1 or incident on the first photoelectric conversion element 20-1 through the intermediate layer 30.

The wavelengths RC and BC passing through the second microlens 40-2 are directly incident on the second photoelectric conversion element 20-2 or incident on the second photoelectric conversion element 20-2 through the intermediate layer 30. The wavelengths RC and GC passing through the third microlens 40-3 are directly incident on the third photoelectric conversion element 20-3 or incident on the third photoelectric conversion element 20-3 through the intermediate layer 30.

Each photonic crystal embodied in each microlens 40-1, 40-2, and 40-3 may include protrusions and grooves. Here, the refractive index of a material corresponding to the protrusions is greater than the refractive index of a material corresponding to a space material formed between the grooves.

The protrusions may be embodied in a plurality of pillars spaced apart from each other.

The refractive index of the pillars may be greater than the refractive index of the space material. For example, the space material may be air. When the pillars are embodied in a pillar material having a specific, refractive index, the space material will be any material whose refractive index is less than the refractive index of the pillar material. In other words, areas between the grooves can be filled with a space material whose refractive index is less than the refractive index of the pillar material.

Wavelengths reflected from a photonic crystal are determined according to a height, a width, and/or a pitch of each protrusion and/or each groove included in the photonic crystal.

A horizontal dimension, e.g., a horizontal length, of each photonic crystal embodied in each microlens 40-1, 40-2, and 40-3 may be longer than the horizontal dimension of each photoelectric conversion element 20-1, 20-2, and 20-3.

Figure 2:
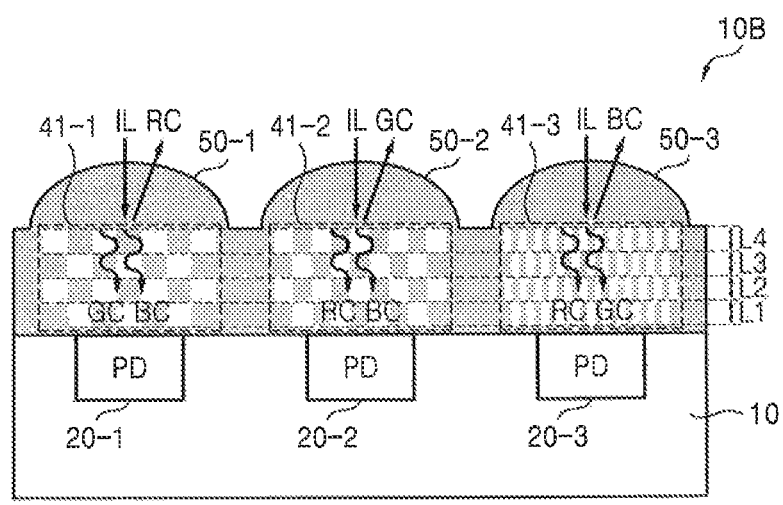
FIG. 2 is a cross-sectional view of pixels of an image sensor according to an exemplary embodiment of the present inventive concept.

FIG. 2 is a cross-sectional view of pixels of an image sensor according to an exemplary embodiment of the present inventive concept. Referring to FIG. 2, pixels 10B of an image sensor include a plurality of photoelectric conversion elements 20-1, 20-2, and 20-3, a plurality of PHOTONIC crystals 41-1, 41-2, and 41-3, and a plurality of microlenses 50-1, 50-2, and 50-3.

When the image sensor is embodied in a BSI image sensor, the plurality of photonic crystals 41-1, 41-2, and 41-3 may be easily formed.

The plurality of photoelectric, conversion elements 20-1, 20-2, and 20-3 may be formed in the semiconductor substrate 10. Each of the plurality of photonic crystals 41-1, 41-2, and 41-3 may be formed or arranged on or above each of the plurality of photoelectric conversion, elements 20-1, 20-2, and 20-3. Each of the plurality of photonic crystals 41-1, 41-2, and 41-3 may function as a three-dimensional (3D) photonic crystal color reflector.

Each photonic crystal 41-1, 41-2, and 41-3 includes a plurality of unit photonic crystals L1, L2, L3, and L4, and each unit photonic crystal L1, L2, L3, and L4 is stacked with respect to each other.

The visible light IL passing through the first microlens 50-1 is incident on the first photonic crystal 41-1. The first photonic crystal 41-1 has a structure to reflect the wavelengths RC of the red region among the visible light IL and to allow the wavelengths GC of the green region and the wavelengths BC of the blue region to pass through.

The visible light IL passing through the second microlens 50-2 is incident on the second photonic crystal 41-2. The second photonic crystal 41-2 has a structure to reflect the wavelengths of the green region GC among the visible light IL, and to allow the wavelengths RC of the red region and the wavelengths BC of the blue region to pass through.

The visible light IL passing through the third microlens 50-3 is incident on the third photonic crystal 41-3. The third photonic crystal 41-3 has a structure to reflect the wavelengths BC of the blue region among the visible light IL, and to allow the wavelengths RC of the red region and the wavelengths GC of the green region to pass through.

The wavelengths GC and BC passing through the first photonic crystal 41-1 are incident on the first photoelectric conversion element 20-1. The wavelengths RC and BC passing through the second photonic crystal 41-2 are incident on the second photoelectric conversion element 20-2. The wavelengths RC; and GC passing through the third photonic crystal 41-3 are incident on the third photoelectric conversion element 20-3. Each unit photonic crystal L1, L2, L3, and L4 of each photonic crystal 41-1, 41-2, and 41-3 may include uneven patterns, e.g., protrusions (e.g., pillars), and grooves formed between the protrusions.

The refractive index of the pillars is greater than the refractive index of a space material between the grooves. For example, the space material may be air. When the pillars are embodied in a pillar material with a specific refractive index, the refractive index of the space material is less than the refractive index of the pillar material.

Wavelengths reflected by each photonic crystal 41-1, 41-2, and 41-3 are determined according to a height, a width, and/or a pitch of each protrusion and/or each groove included in each photonic crystal 41-1, 41-2, and 41-3. The horizontal dimension of each photonic crystal 41-1, 41-2, and 41-3 may be longer than the horizontal dimension of each photoelectric conversion element 20-1, 20-2, and 20-3.

Figure 3:
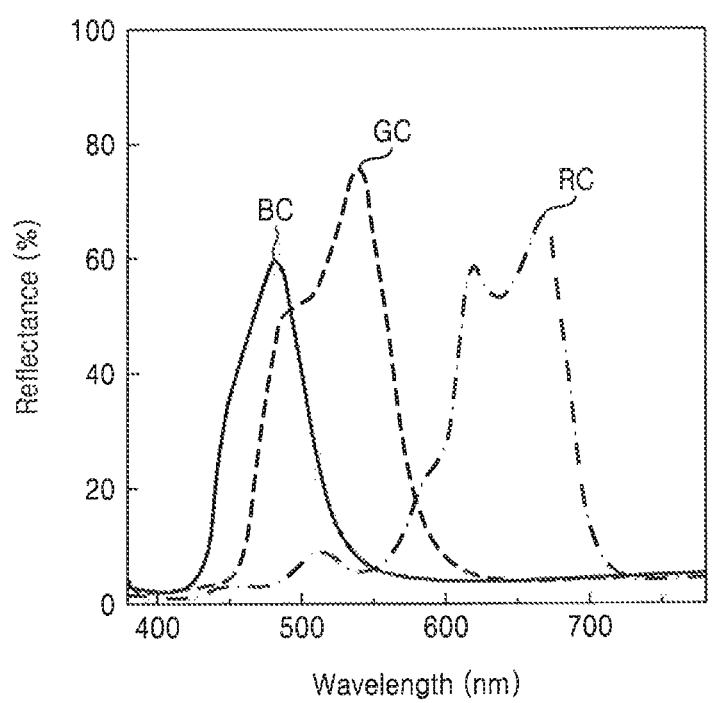
FIG. 3 is a graph showing a reflectance per wavelength of light.
Figure 4:
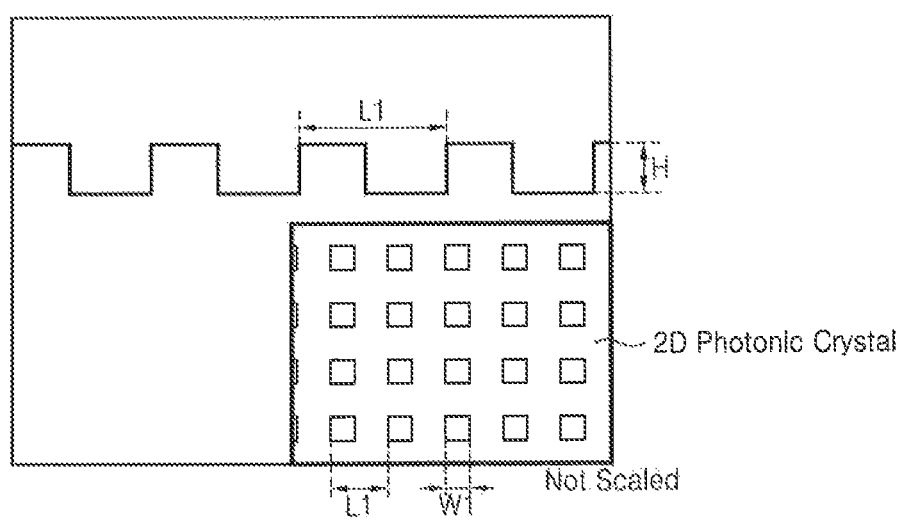
FIGS. 4 to 6 each show a plan view and a cross-sectional view photonic crystals according to an exemplary embodiment of the present inventive concept.
Figure 5:
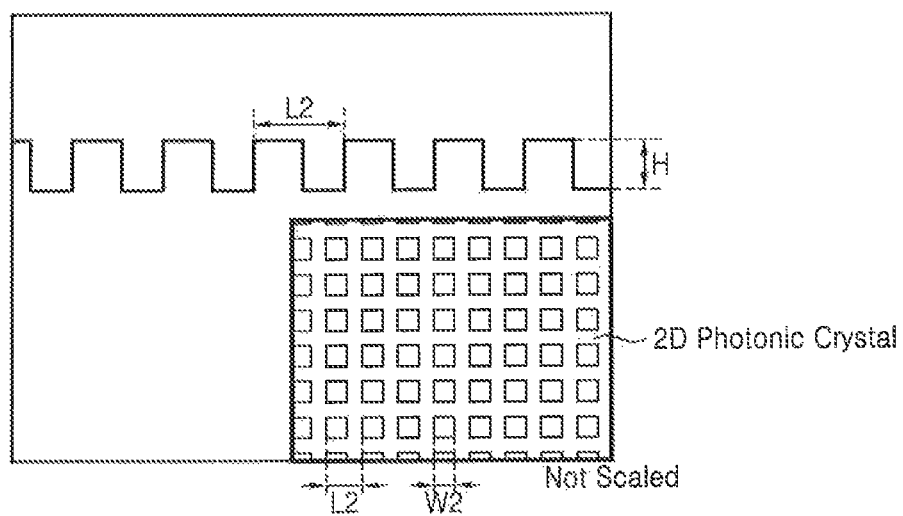
Figure 6:
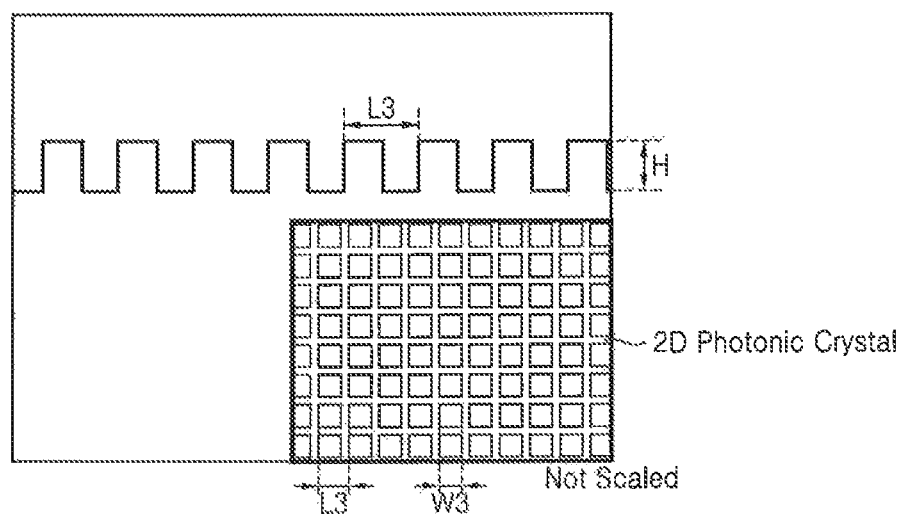

FIG. 3 is a graph showing a reflectance per wavelength of light. The X-axis of FIG. 3 indicates a wavelength, the Y axis indicates reflectance. In FIG. 3, there can be seen the wavelengths BC, GC and RC of a blue region, a green region and a red region and their corresponding reflectances. FIGS. 4 to 6 each show a plan view and a cross-sectional view of photonic crystals according to an exemplary embodiment of the present inventive concept. Referring to FIGS. 4 to 6, each 2D photonic crystal includes a plurality of protrusions and a space material formed between the protrusions.

Each pitch or each pattern size L1, L2, or L3 may be determined based on wavelengths to be reflected. In FIGS. 4 to 6, a height H of each pillar is equally illustrated, however, the height H of each pillar may be determined based on the wavelengths to be reflected.

In other words, the height H of a protrusion, the width W1, W2, and W3 of the protrusion, and/or the pitch L1, L2, and L3 of the protrusion can be determined and designed according to the wavelengths to be reflected.

Moreover, the depth of a groove, the width of the groove, and/or the pitch of the groove may be determined and designed according to the wavelength to be reflected. Here, a width may be a horizontal length or a vertical length of a protrusion.

For example, the 2D photonic crystal of FIG. 4 may reflect the wavelengths RC of the red region and allow the wavelengths GC of the green region and the wavelengths BC of the blue region to pass through.

The 2D photonic crystal of FIG. 5 may reflect the wavelengths GC of the green region and allow the wavelengths RC of the red region and the wavelengths BC of the blue region to pass through.

The 2D photonic crystal of FIG. 6 may reflect the wavelengths BC of the blue region and allow the wavelengths RC of the red region and the wavelengths GC of the green region to pass through.

Figure 7A:
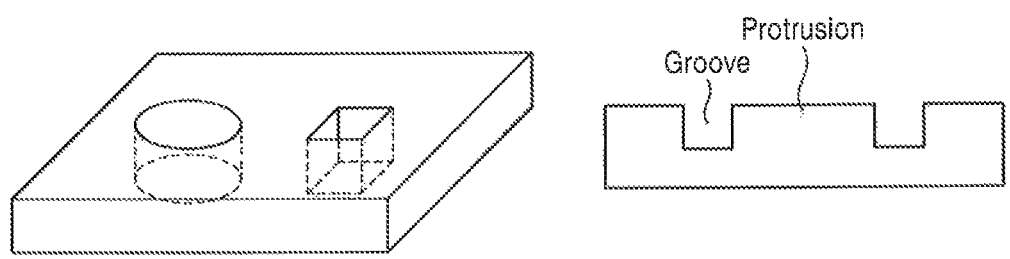
FIGS. 7A and 7B are diagrams each for describing a method of generating protrusions and grooves included in a photonic crystal according to an exemplary embodiment of the present inventive concept.
Figure 7B:
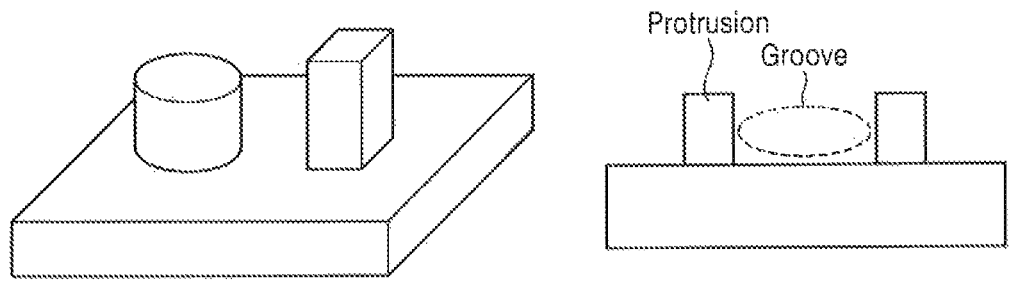

FIGS. 7A and 7B are diagrams each for describing a method of generating protrusions and grooves included in a photonic crystal according to an exemplary embodiment of the present inventive concept. Referring to FIG. 7A, protrusions included in the photonic crystal may be embodied in a groove (e.g., hole)-based structure. Referring to FIG. 7B, the protrusions included in the photonic crystal may be embodied in a pillar (e.g., pole)-based structure.

A horizontal cross-sectional shape of a protrusion or a groove included in the photonic crystal may have a circular, rectangular, pentagonal or polygonal shape. As described above, portions which are etched using a mask become grooves, and portions which are not etched become protrusions.

Figure 8:
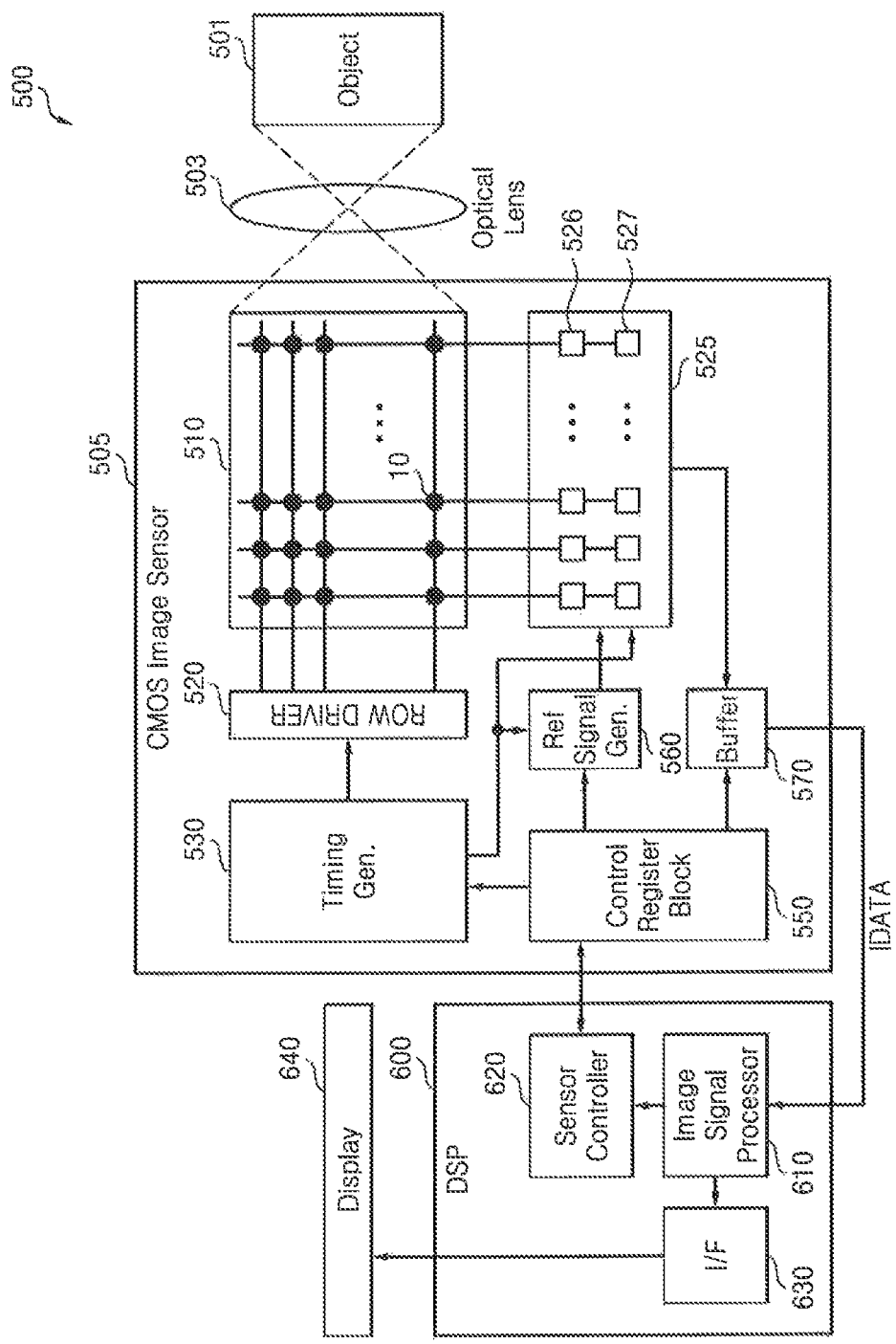
FIG. 8 is a block diagram of a data processing system including the pixels illustrated in FIG. 1 or 2, according to an exemplary embodiment of the present inventive concept.

FIG. 8 is a block diagram of a data processing system including the pixels illustrated in FIG. 1 or 2, according to an exemplary embodiment of the present inventive concept. Referring to FIGS. 1, 2, and 8, a data processing system 500 may be embodied in a, digital camera, a camcorder, or a portable electronic device including a CMOS image sensor 505. The portable electronic device may be embodied in a mobile phone, a smart phone, a tablet personal computer (PC), a mobile internet device (MID), or a wearable computer.

The data processing system 500 includes an optical lens 503, the CMOS image sensor 505, a digital signal processor 600, and a display 640. The CMOS image sensor 505 may generate image data IDATA of an object 501 incident through the optical lens 503.

The CMOS image sensor 505 includes a pixel array 510, a row driver 520, a readout circuit 525, a timing generator 530, a control register block 550, a reference signal generator 560, and a buffer 570. The pixel array 510 includes a plurality of pixels 10A or 10B, collectively referred to hereinafter as 10. The pixels 10 may be manufactured using a CMOS manufacturing process. The pixel array 510 includes the pixels 10 arranged in a matrix shape. The pixels 10 transmit output signals to column lines.

The row driver 520 drives control signals for controlling an operation of each, of the pixels 10 to the pixel array 510 according to a control of the timing generator 530. The row driver 520 may perform a function of a control signal generator which may generate control signals.

The timing generator 530 controls an operation of the row driver 520, the readout circuit 525, and the reference signal generator 560 according to a control of the control register block 550.

The readout circuit 525 includes an analog-to-digital converter 526 per column and a memory 527 per column. According to an exemplary embodiment of the present inventive concept, the analog-to-digital converter 526 may perform a correlated double sampling function. The readout circuit 525 outputs a digital image signal corresponding to a pixel signal output from each pixel 10.

The control register block 550 controls an operation of the timing generator 530, the reference signal generator 560, and the buffer 570 according to a control of the digital signal processor 600.

The buffer 570 transmits image data IDATA corresponding to a plurality of digital image signals output from the readout circuit 525 to the digital signal processor 600. The digital signal processor 600 includes an image signal processor 610, a sensor controller 620, and an interface 630.

The image signal processor 610 controls the sensor controller 620 which controls the control register block 550, and the interface 630. According to an exemplary embodiment of the present inventive concept, the CMOS image sensor 505 and the digital signal processor 600 may be embodied in one package, e.g., a multi-chip package. According to an exemplary embodiment of the present inventive concept, the CMOS image sensor 505 and the image signal processor 610 may be embodied in one package, e.g., a multi-chip package.

The image signal processor 610 processes image data IDATA transmitted from the buffer 570, and transmits the processed image data to the interface 630.

The sensor controller 620 may generate various control signals for controlling the control register block 550 according to a control of the image signal processor 610. The interface 630 may transmit the image data processed by the image signal processor 610 to the display 640.

The display 640 may display image data output from the interface 630. The display 640 may be embodied in a thin film transistor-liquid crystal display (TFT-LCD), a light emitting diode (LED) display, an organic LED (OLED) display, an active-matrix OLED (AMOLED) display, or a flexible display.

Figure 9:
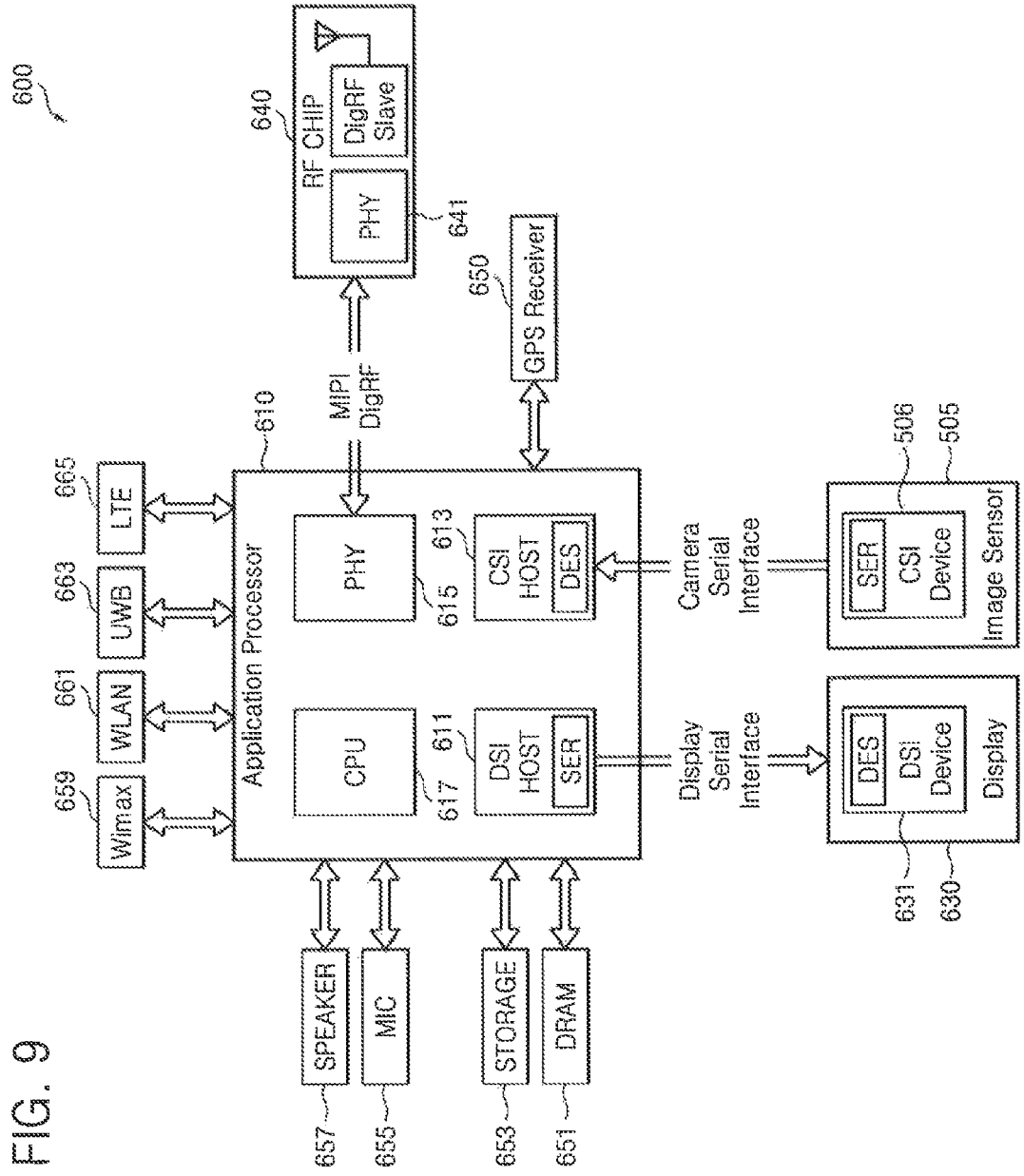
FIG. 9 is a block diagram of a data processing system including the pixels illustrated in FIG. 1 or 2, according to an exemplary embodiment of the present inventive concept.

FIG. 9 is a block diagram of a data processing system including the pixels illustrated in FIG. 1 or 2, according to an exemplary embodiment of the present inventive concept. Referring to FIGS. 8 and 9, the data processing system 600 may be embodied in a portable electronic device which may use or support a mobile industry processor interface (MIPI®). As described above, the portable electronic device includes the CMOS image sensor 505 and a processing circuit which may receive image data IDATA output from the CMOS image sensor 505.

The image processing system 600 includes an application processor (AP) 610, the image sensor 505, and a display 630. A camera serial interface (CSI) host 613 embodied in the AP 610 may perform a serial communication with a CSI device 506 of the image sensor 505 through a camera serial interface (CSI).

According to an exemplary embodiment of the present inventive concept, a de-serializer DES may be embodied in the CSI host 613, and a serializer SER may be embodied in the CSI device 506.

A display serial interface (DSI) host 611 embodied in the AP 610 may perform a serial communication with a DSI device 631 of the display 630 through a display serial interface. According to an exemplary embodiment of the present inventive concept, the serializer SER may be embodied in the DSI host 611, and the de-serializer DES may be embodied in the DSI device 631. Each of the de-serializer DES and the serializer SER may process an electrical signal or a photo signal.

The image processing system 600 may further include a radio frequency (RF) chip 640 which may communicate with the AP 610. A physical layer (PHY) 615 of the AP 610 and a PHY 641 of the RF chip 640 may transmit or receive data to/from each other according to MIPI DigRF. A central processing unit (CPU) 617 embodied in the AP 610 may control operations of the DSI host 611, the CSI host 613 and the PHY 615. The CPU 617 may further control operations of the RF chip 640. For example, the CPU 617 may perform a function of the master for the RF chip 640.

The image processing system 600 may further include a GPS receiver 650, a memory 651 such as a dynamic random access memory (DRAM), a data storage device 653 embodied in a non-volatile memory such as a NAND flash-based memory, a microphone 655, or a speaker 657. The image processing system 600 may communicate with an external device using at least one communication protocol or communication standard, e.g., worldwide interoperability for microwave access (WiMAX) 659, Wireless Local Area Network (WLAN) 661, ultra-wideband (UWB) 663, or long term evolution (LTE™) 665. The image processing system 600 may communicate with an external wireless communication device using Bluetooth or WiFi.

Figure 10:
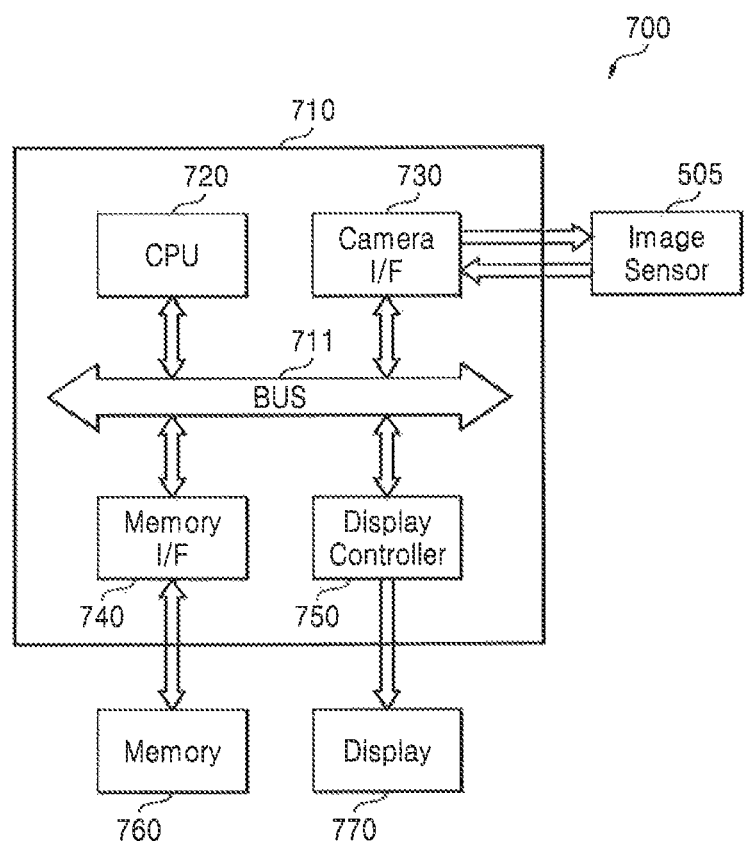
FIG. 10 is a block diagram of a, data processing system including the pixels illustrated in FIG. 1 or 2, according to an exemplary embodiment of the present inventive concept.

According to an exemplary embodiment of the present inventive concept, the AP 610 may further include each component 711, 720, 740, and 750 illustrated in FIG. 10.

FIG. 10 is a block diagram of a data processing system including the pixels illustrated in FIG. 1 or 2, according to an exemplary embodiment of the present inventive concept. Referring to FIGS. 8 and 10, a data processing system 700 may be embodied in a PC or a portable electronic device. As described above, the portable electronic device includes the CMOS image sensor 505 and a processing circuit which may receive image data IDATA output from the CMOS image sensor 505.

The image processing system 700 may include the image sensor 505, a processor 710, a memory 760, and a display (or display device) 770. The image sensor 505 may be included in a camera module. The camera module may include mechanical components which may control an operation of the image sensor 505.

The processor 710 may be embodied in an integrated circuit, a system-on-chip (SoC), an application processor, or a mobile application processor. The processor 710 may control an operation of the image sensor 505, the memory 760, and the display 770, process image data output from the image sensor 505, and store the processed image data in the memory 760 or display the processed image data through the display 770.

The processor 710 includes a CPU 720, a camera interface 730, a memory interface 740, and a display controller 750. The CPU 720 may control operations of the camera interface 730, the memory interface 740, and the display controller 750 through a bus 711.

The CPU 720 may be embodied in a multi-core processor or a multi-CPU. According to a control of the CPU 720, the camera interface 730 may transmit control signals for controlling the image sensor 505 to the image sensor 505, and transmit an image data signal output from the image sensor 505 to the CPU 720, the memory interface 740, and/or the display controller 750.

The memory interface 740 may interface data transmitted or received between the processor 710 and the memory 760. The display controller 750 may transmit data to be displayed on the display 770 to the display 770.

The memory 760 may be a volatile memory such as a DRAM, or a flash-based memory. The flash-based memory may be embodied in a multimedia card (MMC), an embedded MMC (eMMC), an embedded solid state drive (eSSD), or a universal flash memory (UFS).

Figure 11:
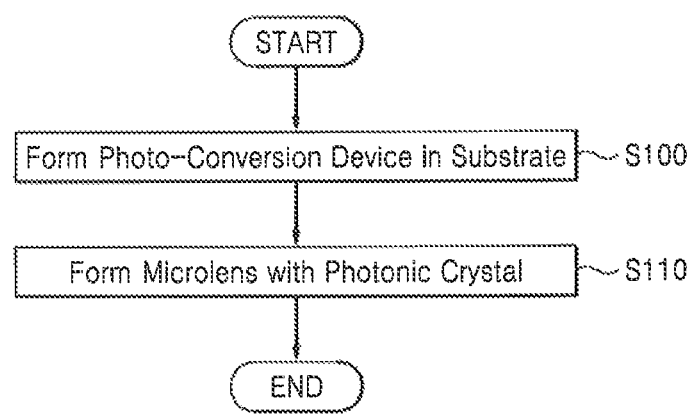
FIG. 11 is a flowchart describing a method of manufacturing a two-dimensional (2D) photonic crystal illustrated in FIG. 1, according to an exemplary embodiment of the present inventive concept.

FIG. 11 is a flowchart which describes a method of manufacturing the 2D photonic crystal illustrated in FIG. 1, according to an exemplary embodiment of the present inventive concept. Referring to FIGS. 1 and 11, each photoelectric conversion element 20-1, 20-2, and 20-3 is formed in the semiconductor substrate 10 (S100). Each microlens 40-1, 40-2, and 40-3 including a corresponding photonic crystal is formed on or above each photoelectric conversion element 20-1, 20-2, and 20-3 (S110). The photonic crystal includes protrusions and grooves defined according to the etching process used to form the protrusions and grooves.

Figure 12:
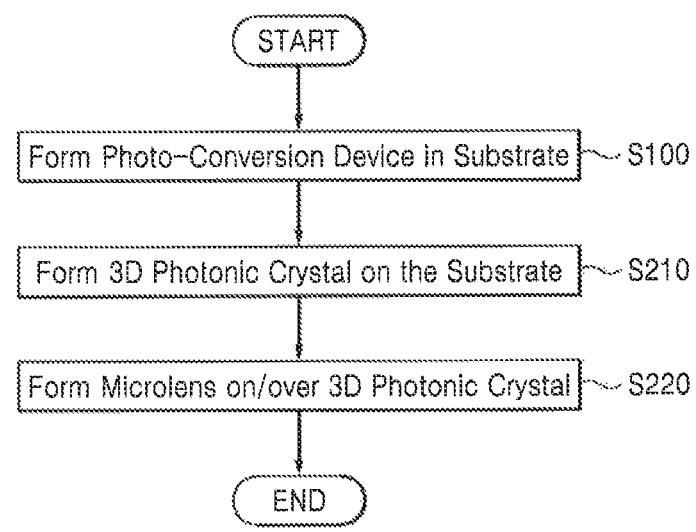
FIG. 12 is a flowchart describing a method of manufacturing a three-dimensional (3D) photonic crystal illustrated in FIG. 2, according to an exemplary embodiment of the present inventive concept.

FIG. 12 is a flowchart which describes a method of manufacturing the 3D photonic crystal illustrated in FIG. 2, according to an exemplary embodiment of the present inventive concept. Referring to FIGS. 2 and 12, each photoelectric conversion element 20-1, 20-2, and 20-3 is formed in the semiconductor substrate 10 (S100). Each 3D photonic crystal 41-1, 41-2, and 41-3 is formed on its corresponding photoelectric conversion element 20-1, 20-2, and 20-3 (S210).

Each microlens 50-1, 50-2, and 50-3 is formed on or above its corresponding 3D photonic crystal 41-1, 41-2, and 41-3 (S220). The shorter a wavelength reflected by a photonic crystal is, the smaller a structure of each of the uneven patterns formed in the photonic crystal, e.g., a 3D image of a protrusion, a 3D image of a groove, a distance or pitch between protrusions, and/or a distance or pitch between grooves, becomes.

An image sensor including a photonic crystal which may be used as a reflective color filter according to an exemplary embodiment of the present inventive concept may increase light transmittance incident on a photoelectric conversion element.

Although the present inventive concept has been shown and described with reference to exemplary embodiments thereof, it will be appreciated by those of ordinary skill in the art that various changes in form and detail may be made thereto without departing from the spirit and scope of the present inventive concept as defined by the appended claims.

What is claimed is:

1. An image sensor, comprising:
    a plurality of pixels, wherein a first pixel of the pixels includes:
    a first photoelectric conversion element;
    a first microlens overlapping the first photoelectric conversion element; and
    a first photonic crystal disposed between the first photoelectric conversion element and the first microlens,
    wherein the first photonic crystal reflects wavelengths of a first region of visible light passing through the first microlens and allows wavelengths of second and third regions of visible light to pass through to the first photoelectric conversion element,
    wherein the first photonic crystal includes a plurality of unit photonic crystals stacked with respect to each other in a vertical direction,
    wherein a unit photonic crystal includes protrusions and grooves formed between the protrusions.

2. The image sensor of claim 1, wherein the image sensor is a backside illumination (BSI) CMOS image sensor.

3. The image sensor of claim 1, wherein the first microlens has a curved surface, the protrusions and the grooves are arranged in the curved surface, and the protrusions or the grooves are arranged at uniform intervals.

4. The image sensor of claim 1, wherein each of the unit photonic crystals includes protrusions and grooves, and the protrusions or grooves are alternately arranged in the vertical direction.

5. The image sensor of claim 1, wherein the protrusions and grooves are alternately arranged.

6. The image sensor of claim 1, wherein the grooves of a first unit photonic crystal overlap the protrusions of a second unit photonic crystal, wherein the first and second unit photonic crystals are disposed adjacent to each other.

7. The image sensor of claim 1, wherein a refractive index of a protrusion is greater than a refractive index of a material disposed in a groove.

8. The image sensor of claim 1, wherein a second pixel of the pixels includes:
    a second photoelectric conversion element;
    a second microlens overlapping the second photoelectric conversion element; and
    a second photonic crystal disposed between the second photoelectric conversion element and the second microlens,
    wherein the second photonic crystal reflects the wavelengths of the second region of visible light passing through the second microlens and allows the wavelengths of the first and third regions of visible light to pass through to the second photoelectric conversion element.

9. The image sensor of claim 8, wherein the second photonic crystal includes a plurality of unit photonic crystals stacked with respect to each other in a vertical direction,
    the unit photonic crystals of the second photonic crystals include protrusions and grooves formed between the protrusions, and
    a dimension of a protrusion or a groove of the unit photonic crystals of the second photonic crystals is different from a dimension of a protrusion or a groove of the unit photonic crystals of the first photonic crystals.

10. The image sensor of claim 9, wherein the protrusions and grooves of the unit photonic crystals of the second photonic crystals are alternately arranged in a vertical direction.

11. An image sensor, comprising:
    first and second pixels,
    the first pixel including a first photonic crystal disposed between a first photoelectric conversion element and a first microlens, wherein the first photonic crystal reflects wavelengths of first light passing through the first microlens and allows wavelengths of second and third light to pass through to the first photoelectric conversion element, and
    the second pixel including a second photonic crystal disposed between a second photoelectric conversion element and a second microlens, wherein the second photonic crystal reflects wavelengths of the second light passing through the second microlens and allows wavelengths of the first light and the third light to pass through to the second photoelectric conversion element,
    wherein the first photonic crystal includes a plurality of unit photonic crystals stacked with respect to each other in a vertical direction,
    wherein a unit photonic crystal includes protrusions and grooves formed between the protrusions.

\* \* \* \* \*